US005620557A

United States Patent [19]
Manabe et al.

[11] Patent Number: 5,620,557
[45] Date of Patent: Apr. 15, 1997

[54] SAPPHIRELESS GROUP III NITRIDE SEMICONDUCTOR AND METHOD FOR MAKING SAME

[75] Inventors: Katsuhide Manabe; Masayoshi Koike; Hisaki Kato; Norikatsu Koide; Isamu Akasaki; Hiroshi Amano, all of Aichi-ken, Japan

[73] Assignee: Toyoda Gosei Co., Ltd., Aichi-ken, Japan

[21] Appl. No.: 494,846

[22] Filed: Jun. 26, 1995

[51] Int. Cl.$^6$ .................................................. H01L 21/00
[52] U.S. Cl. .......................... 438/507; 117/915; 216/101; 438/46; 438/745
[58] Field of Search ................................. 216/36, 76, 101; 156/631.1, 632.1, 662.1, 655.1; 437/86, 974

[56] References Cited

U.S. PATENT DOCUMENTS

| | | | |
|---|---|---|---|
| 4,116,751 | 9/1978 | Zaromb | 156/344 X |
| 4,255,208 | 3/1981 | Deutscher et al. | 148/175 |
| 4,846,931 | 7/1989 | Gmitter et al. | 156/633.1 |
| 5,078,230 | 1/1992 | Maracas et al. | 156/633.1 X |
| 5,173,751 | 12/1992 | Ota et al. | 257/76 |
| 5,278,435 | 1/1994 | Van Hove et al. | 257/184 |
| 5,286,335 | 2/1994 | Drabik et al. | 437/183 X |

OTHER PUBLICATIONS

Hackh's Chemical Dictionary, 4th Ed., Mcgraw Hill, New York, 1972, p. 735.
Matsuoka et al. "Wider–Gap Semiconductor InGaN and InGaAlN Grown by MOVPE", J. of Electronic Materials, 21, 157–163, No.2, 1992.
Detchprohm et al., "Crystal Growth and Properties of Thick GaN layer on Sapphire Substrate", 10th Record of Alloy Semiconductor Physics and Electronics Symposium, Jul. 18–19, 1991, Nagoya. pp. 121–126.
Detchprohm et al., "Hydride Vapor Phase Epitaxial Growth of a High Quality GaN Film Using a ZnOBuffer Layer", Applied Physics Let. vol. 61, No. 22, Nov. 30, 1992 pp. 2688–2690.
Detchprohm et al. "The Growth of Thick GaN Film on Sapphire Substrate by Using ZnO Buffer Layer." Journal of Crystal Growth 128(1993) pp. 384–390.

*Primary Examiner*—William Powell
*Attorney, Agent, or Firm*—Cushman, Darby & Cushman Intellectual Property Group of Pillsbury, Madison & Sutro, LLP

[57] ABSTRACT

A method of manufacturing two sapphireless layers (3a, 3b) at one time made of Group III nitride compound semiconductor satisfying the formula $Al_xGa_yIn_{1-x-y}N$, inclusive of x=0, y=0, and x=y=0, and a LED (10) utilizing one of the semiconductor layers (3a, 3b) as a substrate (3) includes the steps of forming two zinc oxide (ZnO) intermediate layers (2a, 2b) on each side of a sapphire substrate (1), forming two Group III nitride compound semiconductor layers (3a, 3b) satisfying the formula $Al_xGa_yIn_{1-x-y}N$, inclusive of x=0, y=0, and x=y=0, each laminated on each of the intermediate ZnO layers (2a, 2b), and separating the intermediate ZnO layers (2a, 2b) from the sapphire substrate (1) by etching with an etching liquid only for the ZnO layers (2a, 2b). At least one of the so-obtained Group III nitride compound layers is provided with n and p MOVPE layers (4, 5) formed thereon with electrodes (6, 7) on opposite sides to form an LED emitting in the 450 nm region and having a low device resistance.

12 Claims, 3 Drawing Sheets

F I G. 1
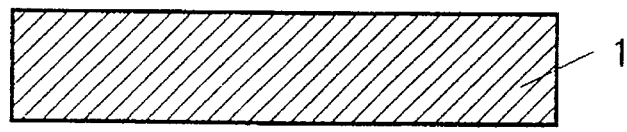
F I G. 2
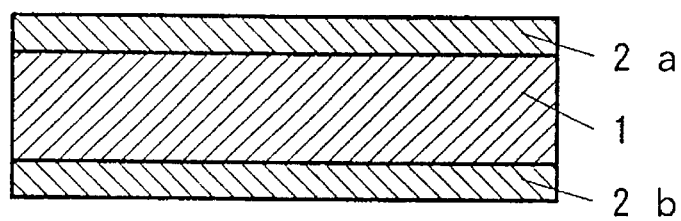
F I G. 3
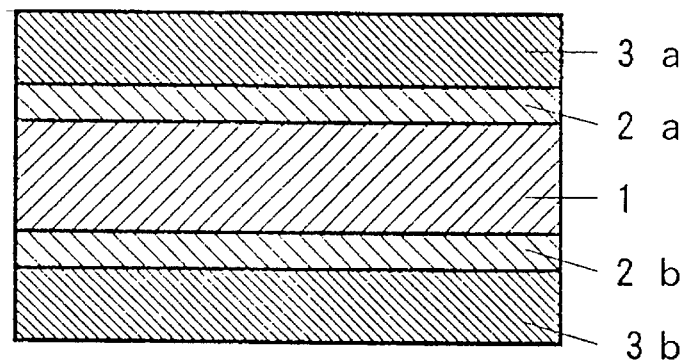

F I G. 7
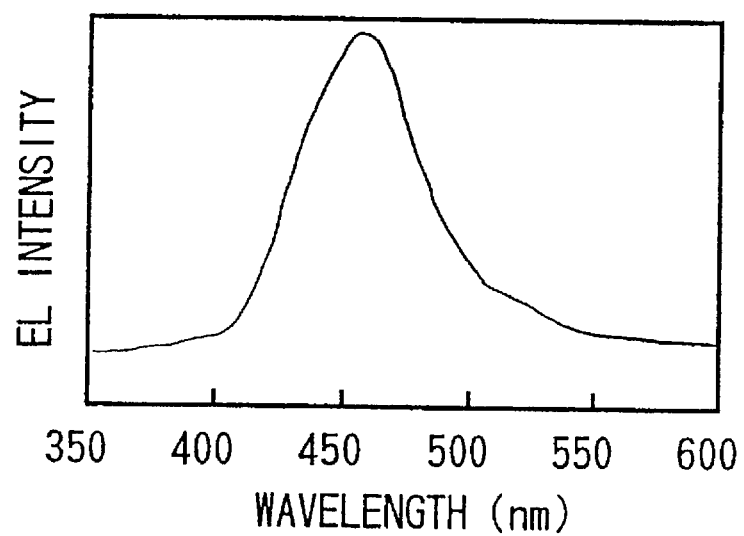

SAPPHIRELESS GROUP III NITRIDE SEMICONDUCTOR AND METHOD FOR MAKING SAME

BACKGROUND OF THE INVENTION

1. Field of the Invention

The present invention relates to a method for manufacturing two epitaxially-grown sapphireless substrates of Group III nitrogen compound semiconductor at one time, the substrates produced by the method, and the manufacture of a LED utilizing the substrates so-produced.

2. Description of the Related Art

It has been known that a gallim nitride (GAN) compound semiconductor may be used to obtain a light-emitting diode (LED) that emits blue light. This semiconductor is useful because of its high luminous efficiency resulting from direct electron transition and its ability to emit blue light, which is one of the three primary colors.

A Group III nitrogen compound semiconductor satisfying the formula $Al_xGa_yIn_{1-x-y}N$, inclusive of x=0, y=0, and x=y=0, is also used in LEDS material that emit light in the entire visible short wavelength and ultraviolet regions. This semiconductors is useful because it has an energy band gap equivalent to the wavelength of 200 to 650 nm and has a direct electron transition characteristic.

It, however, has been difficult to produce bulk single crystalline Group III nitride compound semiconductor because the equilibrium vapor pressure of the nitrogen, as one of the components, is extremely high at the growth temperature of the semiconductor. Therefore, the Group III nitride compound semiconductor grown epitaxially on a sapphire substrate has always been used. Namely, the LED employing the semiconductor is always being used with a sapphire substrate resulting in a structural constraint in forming the electrodes, light emission inefficiency and so on, because of the sapphire substrate.

In actuality, electrodes for an n-layer and a p-layer cannot sandwich those layers because the substrate is insulative. Therefore, the electrodes for those layers have been formed only on a surface layer of the LED. This structural constraint has inevitably required additional manufacturing processes to form a groove which insulates these two electrodes from each other and a hole in which the electrode for either a lower layer of the two, the p-layer or the n-layer, is formed.

Further, the LED with this structure requires feed currents to the lower layer in parallel to its surface. Consequently, the resistivity of the LED becomes undesirably high, enlarging the voltage drop, and increasing the Joule heat energy expended by the device.

A single crystalline ZnO layer has been used as a buffer layer that helps grow the Group III nitride compound semiconductors with the fine crystallinity on the sapphire substrate mitigating lattice differences. However, luminous intensity of the conventional LED is not as good as expected in spite of the fine crystallinity of each layer and the lattice match between the sapphire substrate and the ZnO buffer layer, and between the ZnO layer and the Group III nitride compound semiconductor.

SUMMARY OF THE INVENTION

It is, therefore, an object of the present invention to manufacture a sapphireless single crystalline substrate of the Group III nitride compound semiconductor satisfying the formula $Al_xGa_yIn_{1-x-y}N$, inclusive of x=0, y=0, and x=y=0.

It is another object of the present invention to manufacture a LED with improved luminous efficiency by employing the sapphireless single crystalline substrate.

According to the first aspect of the invention, a manufacturing method is provided for forming two sapphireless substrates at one time comprising the steps of:

forming a zinc oxide (ZnO) layer on each side of a sapphire substrate;

forming a semiconductor layer made of Group III nitride compound semiconductor satisfying the formula $Al_xGa_yIn_{1-x-y}N$, inclusive of x=0, y=0, and x=y=0 on each of the ZnO layers;

etching the intermediate ZnO layers with an etching fluid capable of etching ZnO only (ZnO-specific); and separating two semiconductor layers from the sapphire substrate so as to obtain free-standing semiconductor layers.

The ZnO layer is not single crystalline, whose thickness is designed to have an intermediate lattice character between that of the sapphire and the ZnO. Namely, the crystallinity of the ZnO buffer layer is deteriorated in view of its purity as compared with the conventional ZnO buffer layer of the conventional LED. However, the Group III nitride compound semiconductors fabricated on the ZnO buffer layer with the intermediate lattice character results in improved luminous intensity. Further, etching the ZnO intermediate buffer layers enables creation of two Group III nitride compound free-standing semiconductors at one time resulting in a shortened manufacturing process. Further, manufacturing two semiconductors at a time enables creation of a symmetrical pair of warp-free semiconductors.

Consequently, a wafer of the Group III nitride compound semiconductors with fine quality as a whole is easily obtained.

Other objects, features, and characteristics of the present invention will become apparent upon consideration of the following description and the appended claims with reference to the accompanying drawings, all of which form a part of the disclosure and wherein referenced numerals designate corresponding parts in the various figures.

BRIEF DESCRIPTION OF THE DRAWING

FIGS. 1 through 3 are sectional views illustrating a process for manufacturing two sapphireless GaN semiconductor substrates embodied in the described example;

FIG. 7 is a luminous characteristic feature of the LED in the example.

DETAILED DESCRIPTION OF EXEMPLARY EMBODIMENTS

Figure 4:
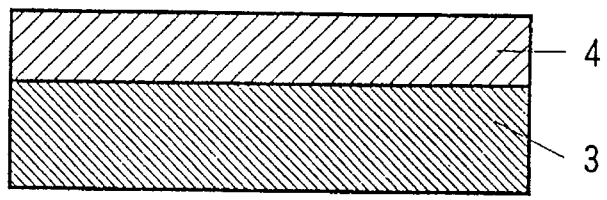
FIGS. 4 through 6 are sectional views illustrating a process for manufacturing LED with the sapphireless GaN semiconductor substrate embodied in the example.

FIGS. 1 to 3 show a series of manufacturing process steps for manufacturing two, free-standing GaN compound sapphireless semiconductor films or layers.

As shown in FIG. 1, a c(0001)-oriented single crystalline sapphire substrate 1, which was cleaned by an organic washing solvent, such as methyl alcohol, was placed on a susceptor in a chamber for RF sputtering. After the chamber was evacuated to about $10^{-5}$ Torr, a mixed gas of argon (Ar) and oxygen ($O_2$) was released into the chamber for sputtering a ZnO target. Thereby, intermediate ZnO layers 2a and 2b with a 100 nm thickness each were deposited on both sides of the sapphire substrate 1 as shown in FIG. 2. The layers 2a and 2b exhibited a strong orientation towards the c-axis.

The sapphire substrate 1, sandwiched by the ZnO layers 2a and 2b, was placed in a chamber for hyride vapor phase epitaxy treatment. After the chamber was evacuated, nitride gas was introduced into the chamber, and the sapphire substrate 1 was heated up to 1000° C., which is the suitable temperature for the growth of a single crystalline GaN layer on each of the intermediate layers 2a and 2b. At this time, the orientation degrees of the ZnO layers 2a and 2b intermediate the sapphire substrate 1 and the GaN layers 3a and 3b, were improved, enabling the GaN layer to grow thereon, respectively.

GaCl which was produced by the reaction of Ga and hydrogen chloride (HCl) at high temperature was employed as a raw material gas for gallium (Ga). $NH_3$ was used as a raw material gas for nitrogen (N). GaCl and $NH_3$ were released over both surfaces of the sapphire substrate 1 for GaN growth. As shown in FIG. 3, GaN semiconductor layers 3a and 3b of 300 μm thickness each were fabricated on each of the intermediate ZnO layers 2a and 2b, sandwiching the sapphire substrate 1 by five hours growth.

Then, the sapphire substrate 1, with the intermediate ZnO layers 2a and 2b and the GaN semiconductor layers 3a and 3b, thereon, was dipped into an etching liquid of hydrochloric acid. Then, the etching liquid was heated up to 60° C. The intermediate ZnO layers 2a and 2b were etched off during a ten minute treatment in an ultrasonic washing device. Thereby, the GaN semiconductor layers 3a and 3b were separated from the sapphire substrate 1 by dissolving the intermediate ZnO buffer layers. Both of the so-obtained GaN semiconductor layers 3a and 3b exhibited n-type conductivity, which had about a $3 \times 10^{17}/cm^3$ electron concentration and about a 400 $cm^2/V \cdot s$ electron mobility at room temperature.

The thickness of the ZnO buffer layer was 100 nm in this embodiment. Alternatively, the thickness can be altered in the range of 10 nm to 1 μm. It is not preferable to use a thinner ZnO buffer layer than 10 nm, because it is too thin to function as an effective buffer layer. It is not preferable to use a thicker ZnO buffer layer than 1 μm because it is too thick to have an intermediate lattice character between the sapphire and the Group III nitride compound semiconductors.

Then, a LED 10 (FIG. 6) was manufactured on one of the GaN semiconductor layers 3a and 3b of 300 μm thickness, which is labeled as substrate 3, by gaseous phase growth, called metal organic vapor phase epitaxy referred to as MOCPE hereinafter.

The gases employed in this process were ammonia ($NH_3$), a carrier gas ($H_2$), trimethyl gallium ($Ga(CH_3)_3$) (TMG hereinafter), trimethyl aluminum ($Al(CH_3)_3$) (TMA hereinafter), silane ($SiH_4$), biscyclopentadienyl magnesium ($Mg(C_5H_5)_2$) ($CP_2Mg$ hereinafter) and diethylzinc (DEZ hereinafter).

A GaN semiconductor substrate 3, manufactured in accordance with the above-described method, was placed on a susceptor in a reaction chamber for the MOVPE treatment. After the chamber was evacuated, $H_2$ and $NH_3$ were released therein, heating the temperature of the GaN semiconductor substrate 3 up to 1000° C. The $NH_3$ gas feed is indispensable for preventing GaN molecules in the GaN semiconductor substrate 3 from sublimating into the interior of the chamber.

Then, a 1 μm thick GaN buffer layer 4 of n-type conduction was formed on the GaN semiconductor substrate 3, as shown in FIG. 4, under the conditions of supplying $H_2$ at a flow rate of 20 litter/min., $NH_3$ at 10 litter/min., TMG at $1.7 \times 10^{-4}$ mol/min., and diluted silane to 0.86 ppm by $H_2$ at 200 ml/min. for 20 min.

Figure 5:
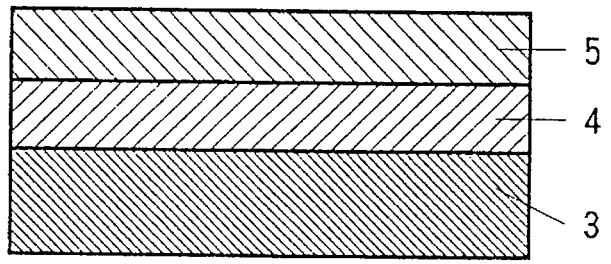

As shown in FIG. 5, a 0.5 μm thick GaN i-layer 5 was formed on the GaN buffer layer 4 under the conditions of keeping the temperature of the GaN semiconductor layer 3 at 900° C. and supplying $H_2$ at a flow rate of 20 liter/min., $NH_3$ at 10 liter/min., TMG at $1.7 \times 10^{-4}$ mol/min., and $CP_2Mg$ $2 \times 10^{-7}$ mol/min. for 10 min. At this stage, the i-layer 5 remained insulative.

Then, electron rays were uniformly irradiated into the i-layer 5 using a reflective election beam diffraction device. The irradiation conditions were set at 10 KV for the accelerating voltage, 1 μA for the sample current, 0.2 mm/sec. for the speed of beam scanning, 60 μmφ for the beam aperture, and $2.1 \times 10^{-5}$ Torr vacuum. This irradiation changed the insulative i-layer 5 with a resistivity of $10^8$ $\Omega \cdot cm$ or more into a p-type conductive semiconductor with a resistivity of 40 $\Omega \cdot cm$. Thereby, the p-layer 5 with p-type conduction was obtained. Accordingly, a wafer of multi-structural layers was obtained as shown in FIG. 5.

Figure 6:
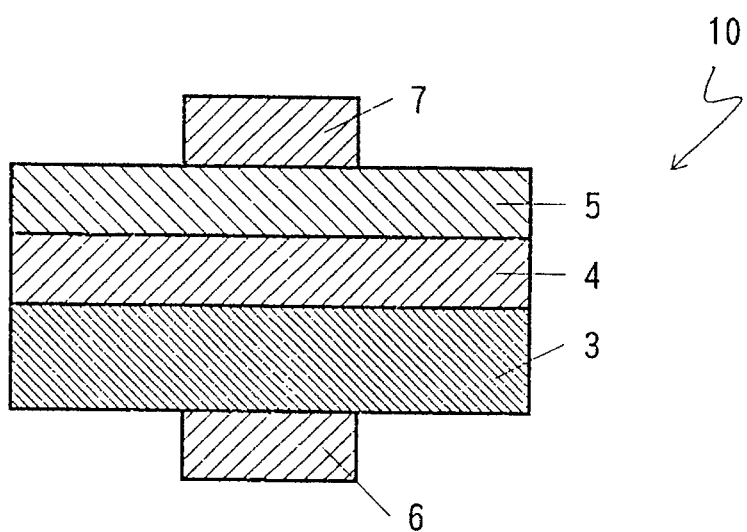

As shown in FIG. 6, two electrodes 6 and 7 with 1 mm diameter each were formed by vapor deposition. The electrode 6 which was made of aluminum (Al) was formed on the GaN semiconductor substrate 3 of n-layer. The electrode 7, which was made of gold (Au), was formed on the p-layer 5.

The series resistance of the so-obtained LED 10 with a PN function was found to become small. Although a conventional LED, which has a hole from the surface of the p-layer 5 extending to the n-layer 3 and an electrode for the n-layer 3 formed in the hole, has a serial resistance of 50 Ω in the connection of the n-layer 3 and the GaN buffer layer 4, the LED 10 of the present invention had a corresponding resistance of 0.2 Ω. Namely, the resistance of the LED 10 in the present invention decreased to one two-hundred and fiftieth of that of the conventional LED.

FIG. 7 shows a luminous characteristic feature of the LED 10 at a drive current of 10 mA. The LED 10 has a peak wavelength appearing at 450 nm and a blue emission color. Further, the luminous efficiency of the LED 10 was found to be twice as much as that of the conventional LED.

The thickness of the intermediate ZnO layers 2a and 2b were 100 nm each in the present invention. Alternatively, the thickness can be in the range of 10 nm to 1 μm.

The LED 10 with a PN junction structure was employed in the present invention. Alternatively, a LED with a PIN structure or a MIS structure can be used.

The GaN semiconductor substrate 3 was used as the substrate of the LED 10 in the present invention. Alternatively, InGaN or AlGaN can be employed as the substrate.

Further, a LED with a hetero-junction structure made of heterogeneous semiconductor materials can be used alternatively.

While the invention has been described in connection with what are presently considered to be the most practical and preferred embodiments, it is to be understood that the invention is not to be limited to the disclosed exemplary embodiments, but on the contrary, is intended to cover various modifications and equivalent arrangements included within the spirit and scope of the appended claims.

What is claimed is:

1. A method for manufacturing a gallium nitride (GAN) sapphireless semiconductor film, comprising the steps of:

forming zinc oxide (ZnO) layers on respective ones of at least two sides of a sapphire substrate;

forming semiconductor layers of Group III nitride compound semiconductor satisfying the formula $Al_xGa_yIn_{1-x-y}N$, inclusive of x=0, y=0, and x=y=0 on respective ones of said ZnO layers;

etching said ZnO layers with a ZnO-specific etchant; and separating said semiconductor layers from said sapphire substrate.

2. A semiconductor produced by:

forming zinc oxide (ZnO) layers on respective ones of at least two sides of a sapphire substrate;

forming semiconductor layers of Group III nitride compound semiconductor satisfying the formula $Al_xGa_yIn_{1-x-y}N$, inclusive of x=0, y=0, and x=y=0 on respective ones of said ZnO layers;

etching said ZnO layers with a ZnO-specific etchant; and separating said semiconductor layers from said sapphire substrate.

3. The method of claim 1, wherein said ZnO layers have a thickness of 10 nm to 1 μm each.

4. The semiconductor of claim 2, wherein said ZnO layers have a thickness of 10 nm to 1 μm each.

5. The method of claim 1, wherein at least one of said semiconductor layers comprises an n-layer of n-type nitrogen-Group III compound semiconductor satisfying the formula $Al_xGa_yIn_{1-x-y}N$, inclusive of x=0, y=0, and x=y=0, and a p-layer of p-type nitrogen-Group III compound semiconductor satisfying the formula $Al_xGa_yIn_{1-x-y}N$, inclusive of x=0, y=0, and x=y=0.

6. The semiconductor of claim 2, wherein at least one of said semiconductor layers comprises an n-layer of n-type nitrogen-Group III compound semiconductor satisfying the formula $Al_xGa_yIn_{1-x-y}N$, inclusive of x=0, y=0, and x=y=0, and a p-layer of p-type nitrogen-Group III compound semiconductor satisfying the formula $Al_xGa_yIn_{1-x-y}N$, inclusive of x=0, y=0, and x=y=0.

7. The method of claim 1, wherein at least one of said semiconductor layers comprises two n-layers of n-type nitrogen-Group III compound semiconductor satisfying the formula $Al_xGa_yIn_{1-x-y}N$, inclusive of x=0, y=0, and x=y=0, and a p-layer of p-type nitrogen-Group III compound semiconductor satisfying the formula $Al_xGa_yIn_{1-x-y}N$, inclusive of x=0, y=0, and x=y=0, said two n-layers having different electron concentrations from each other.

8. The semiconductor of claim 2, wherein at least one of said semiconductor layers comprises two n-layers of n-type nitrogen-Group III compound semiconductor satisfying the formula $Al_xGa_yIn_{1-x-y}N$, inclusive of x=0, y=0, and x=y=0, and a p-layer of p-type nitrogen-Group III compound semiconductor satisfying the formula $Al_xGa_yIn_{1-x-y}N$, inclusive of x=0, y=0, and x=y=0, said two n-layers having different electron concentrations from each other.

9. The method of claim 1, wherein said at least two sides of said sapphire substrate are opposing sides of said sapphire substrate.

10. The semiconductor of claim 2, wherein said at least two sides of said sapphire substrate are opposing sides of said sapphire substrate.

11. The method of claim 1, further comprising the steps of:

forming a GaN buffer layer on a side of one of said semiconductor layers;

forming a GaN i-layer on said GaN buffer layer;

irradiating said GaN i-layer with electrons so as to form a p-layer having p-type conduction.

12. The method of claim 11, further comprising the steps of:

forming a first electrode on said semiconductor layer and a second electrode on said p-layer.

* * * * *

UNITED STATES PATENT AND TRADEMARK OFFICE
CERTIFICATE OF CORRECTION

PATENT NO.   : 5,620,557
DATED        : April 15, 1997
INVENTOR(S)  : Manabe et al.

It is certified that error appears in the above-identified patent and that said Letters Patent is hereby corrected as shown below:

<u>Title page,</u>
Item [73], Assignee, please change "Toyoda Gosei Co., Ltd., Aichi-ken, Japan" to
-- Toyoda Gosei Co., Ltd., Isamu Akasaki; Hiroshi Amano, all of Aichi-ken, Japan --

Signed and Sealed this

Twentieth Day of August, 2002

*Attest:*

*Attesting Officer*

JAMES E. ROGAN
*Director of the United States Patent and Trademark Office*